United States Patent [19]

Le Mehaute et al.

[11] Patent Number: 5,293,037
[45] Date of Patent: Mar. 8, 1994

[54] OPTO-ELECTRONIC CONVERTER WITH ELECTRON MIRRORS AND QUANTUM WIRE

[75] Inventors: Alain Le Mehaute, Gif sur Yvette; Christian Joachim, Lagardelle sur Leze, both of France

[73] Assignee: Alcatel Alsthom Compagnie Generale d'Electricite, Paris, France

[21] Appl. No.: 915,513

[22] Filed: Jul. 20, 1992

[30] Foreign Application Priority Data

Jul. 19, 1991 [FR] France ................. 91 09175

[51] Int. Cl.⁵ ............................. H01J 40/14
[52] U.S. Cl. .................. 250/214.1; 257/431; 257/459
[58] Field of Search ............. 250/214.1; 257/24, 27, 257/192, 431, 449, 459

[56] References Cited

U.S. PATENT DOCUMENTS 3,917,943  11/1975  Auston ................. 250/211 J
4,695,733  9/1987  Pesavento .
4,982,248  1/1991  Laibowitz et al. .................. 257/280

FOREIGN PATENT DOCUMENTS 1586458  3/1981  United Kingdom .

OTHER PUBLICATIONS

Patent Abstracts of Japan, vol. 11, No. 17 (E-471)(2464) Jan. 17, 1987 & JP-A-61 189 674 (Sharp Corp.) Aug. 23, 1986.
Optics Communications, vol. 32, No. 3, Mar. 1980, Amsterdam, Netherlands, pp. 485–488; P. S. Mak et al.: "Picosecond Optoelectronic Switching in CdSO.5-SeO.5".
Patent Abstracts of Japan, vol. 9, No. 62 (P-342) Mar. 19, 1985 & JP-A-59 195 60 (Ricoh KK), Nov. 6, 1984.
Physics Today, Feb. 1990, New York, USA, pp. 24–30; H. I. Smith et al.: "Nanofabrication".

*Primary Examiner*—David C. Nelms
*Attorney, Agent, or Firm*—Sughrue, Mion, Zinn, Macpeak & Seas

[57] ABSTRACT

An opto-electronic converter comprises a mesoscopic resonant cavity constituted by a quantum wire made of a material that is a conductor or a semiconductor and situated between two electron mirrors of nanometer size, the said wire being interrupted over a gap having a width of a few tens of Å, into which gap a photosensitive material is inserted, tabs being provided at the ends of said cavity to pass an electrical current.

13 Claims, 1 Drawing Sheet

OPTO-ELECTRONIC CONVERTER WITH ELECTRON MIRRORS AND QUANTUM WIRE

The present invention relates to an opto-electronic converter intended in particular for use as a basic component in communications systems and in information processing systems having a very high degree of integration.

BACKGROUND OF THE INVENTION

An opto-electronic converter is a component whose electromagnetic impedance varies as a function of the optical energy or of the static electric field it receives.

At present, the smallest components of this kind (about 100 Å) include a material having a non-linear response, e.g. of the II-VI semiconductor type, such as CdS or $CdS_xSe_{1-x}$, enclosed in beads of glass that vary in color both due to variation in composition and due to quantum confinement. These materials suffer from the defect of not being very stable over time.

The same materials, or III-V type semiconductor materials having properties of the same type, e.g. InGaAs, can be optimized in systems of millimeter size.

It is also known that non-linear properties can be increased by reducing size, as mentioned in articles published in J. Opt. Soc. Am. B2 (1985) 1155 and Phys. Rev. B36 (1987) 9293. However, those systems still have dimensions of the order of several millimeters.

An object of the present invention is to provide an opto-electronic converter whose dimensions are of the order of a nanometer.

SUMMARY OF THE INVENTION

The present invention provides an opto-electronic converter comprising a mesoscopic resonant cavity constituted by a quantum wire made of a material that is a conductor or a semiconductor and situated between two electron mirrors of nanometer size, the said wire being interrupted by a gap having a width of a few tens of Å, into which gap a photosensitive material is inserted, tabs being provided at the ends of said cavity to pass an electrical current.

The term "mesoscopic resonant cavity" is used to designate a resonant cavity of nanometer size.

The principle on which said cavity operates is impedance modulation of the quantum electron line by means of a lightwave whose purpose is to change the energy levels that are accessible on the molecule of photosensitive material.

The term "photosensitive material" is used to designate a photosensitizer such as rhodamine B, a dye such as azo molecules or cyanines, thiazoles, xanthenes, and semiconductors of II-IV or III-V type as mentioned above.

The photons absorbed in the photosensitive material change the conductivity of the cavity.

In one embodiment, said quantum wire has:
a length lying in the range 100 Å to 5,000 Å;
a width lying in the range 20 Å to 500 Å; and
a thickness lying in the range 2 Å to 10 Å.

The width of said gap may lie in the range 5 Å to 100 Å.

Said current suitable for being applied to said quantum wire lies in the range $10^{-8}$ A to $10^{-16}$ A.

The material of said quantum wire may be selected from gold, silver, copper, platinum, a gold-palladium alloy, or any other noble metal; alternatively it may be a doped semiconductor such as doped silicon or AsGa, or it may be an electron conductive polymer.

The electron mirror is made by creating an impedance break at the ends of the wire:
by a change of material, e.g. by changing from copper to gold or from AsGa to Pt; or else
merely by a narrow void, e.g. having a width of 1 Å.

The light energy applied to the photosensitive material is extremely small. It is of the order of a fraction of a picojoule. This energy suffices to vary the impedance of the cavity between said tabs.

Since the energy dissipated in the converter of the invention is extremely small, the converter can be used without difficulty at very low temperature.

The converter of the invention may be made on an insulating medium of silica or silicon using known nanolithographic techniques. Such techniques are described, in particular, in the following articles:

[1] "Nanofabrication" by H. I. Smith et al., Physics Today, February 1990, pp. 24 to 30.

[2] "Nanolithograph with a high resolution STEM" by C. P. Umbach et al., IBM J. Res. Develop., Vol. 32, No. 4, July 1988, pp. 454 to 461.

[3] "Nanostructure technology" by T. H. P. Chang et al., IBM J. Res. Develop., Vol. 32, No. 4, July 1988, pp. 462 to 487.

[4] "Resolution limits for electron-beam lithography" by A. N. Broers, IBM J. Res. Develop., Vol. 32, No. 4, July 1988, pp. 502 to 512.

BRIEF DESCRIPTION OF THE DRAWING

An embodiment of the invention is described by way of example with reference to the accompanying drawing, in which.

DETAILED DESCRIPTION

Figure 1:
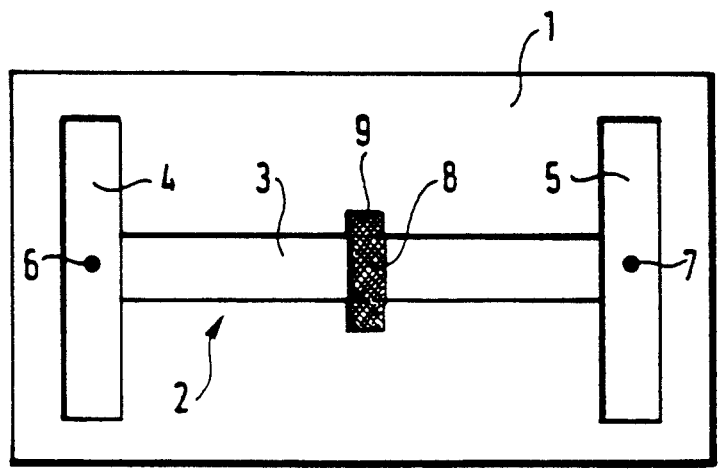
FIG. 1 is a highly diagrammatic plan view of an opto-electronic converter of the invention.

The starting material is a medium 1 based on silica, such as a membrane of $SiN_4$ having a thickness of 1,000 Å. A mesoscopic cavity 2 of noble metal, such as gold-palladium is formed therein by a nanolithographical technique. This cavity is constituted by a quantum wire 3 having a length of 5,000 Å, a width of 300 Å, and a thickness of 10 Å. It is closed by two mirrors 4 and 5 made of copper and extending the wire 3. Two tabs 6 and 7 of gold or of silver are provided to feed current to the cavity 2.

The quantum wire 3 is cut by electron bombardment at 300 kilovolts over a distance 8 that is about 50 Å. A material 9 such as photosensitive rhodamine B is inserted in the gap formed in this way. The method consists in putting said material into solution in a solvent and then in impregnating the gap and allowing the solution to dry. Such a material is sensitive to light radiation at a wavelength lying in the range 0.3 µm to 0.8 µm, at an energy of $10^{-3}$ picojoules.

It is preferable to use styril 9 for absorption around 700 nm, rhodamine B for 590 nm, rhodamine 66 for 530 nm, coumarin 6 for 500 nm, coumarin 102 for 450 nm, and stylbene 3 for 400 nm.

Figure 2:
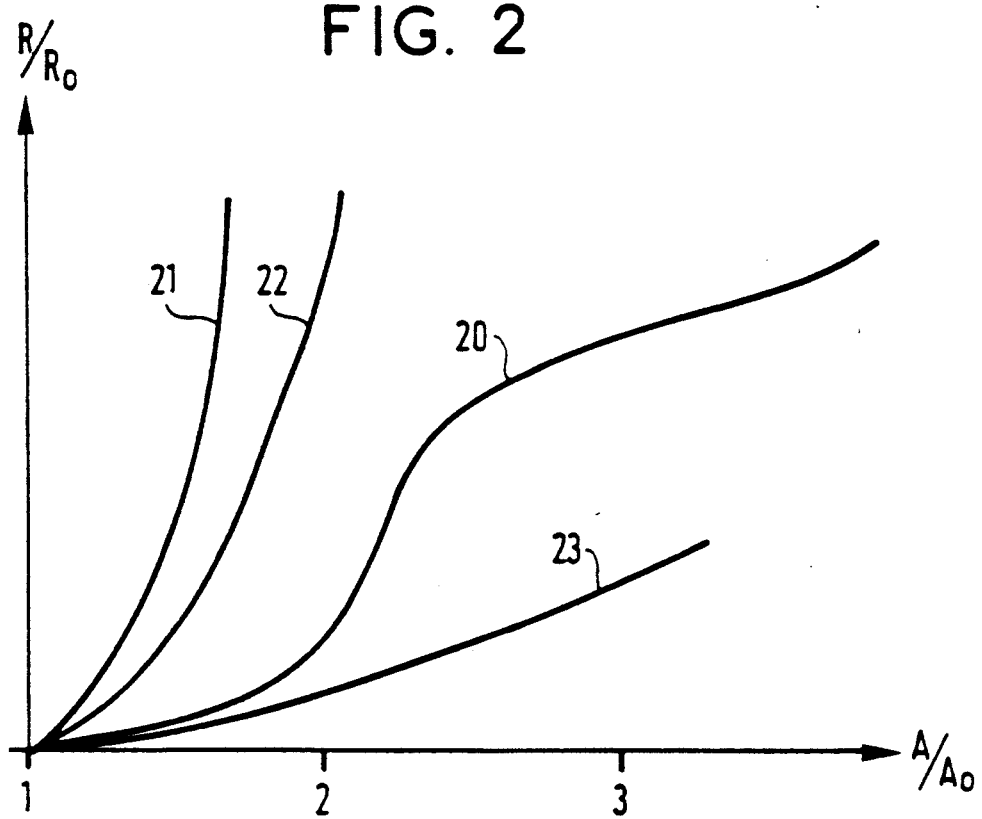
FIG. 2 is a graph showing variations in the admittance of a cavity of the invention as a function of the incident lightwave.

When an alternating current or a direct current is fed via the tabs 6 and 7 into the cavity of the invention, any change in the illumination of the photosensitive molecules will give rise to a change in the impedance and thus in the transmittance of the cavity, which effect will have a consequence on the ratio of current divided by voltage. An optical property is thus electrically detectable, as shown in FIG. 2, in which:

the abscissa represents the ratio $A/A_0$ corresponding to the normalized amplitude of the incident optical wave; and the ordinate represents the ratio $R/R_O$ corresponding to the normalized admittance of the cavity.

The curve 20 corresponds to a gap 8 of width 50 Å, whereas curves 21, 22, and 23 correspond to cavities of the same kind but having a gap 8 of the following widths respectively: 10 Å, 15 Å, and 100 Å.

In another embodiment, a tunnel microscope head is used to position a certain number of rhodamine B molecules in the gap 8. (This highly accurate method has the additional advantage of making it possible to place different photosensitive molecules in a plurality of cavities that are connected in series or parallel, which molecules may be sensitive to different wavelengths.)

Given the dimensions of the opto-electronic converter of the invention, it is possible to integrate more than 100,000 of them on a medium occupying 1 mm$^2$.

Naturally, the materials in the cavity as described above may be replaced by other materials.

Thus, the medium 1 may be GaAs covered with a non-doped membrane of AlGaAs having a thickness of 1,000 Å. AlGaAs can be doped with indium or phosphorus to form a wire having the dimensions given above. The mirrors are made of platinum and the current feeds are of gold or of silver.

In another variant, the membrane is of doped AlGaAs and the wire of the cavity is of undoped AlGaAs. Any other equivalent disposition may be considered.

We claim:

1. An opto-electronic converter comprising a mesoscopic resonant cavity constituted by a pair of electron mirrors and a quantum wire made of a material that is conductor or a semiconductor and situated between said electron mirrors, said wire being interrupted over a gap having a width of 5 Å to 100 Å, a photosensitive material inserted into said gap, and tabs provided at the ends of said cavity and connected to respective ones of said mirrors and said quantum wire to pass an electrical current through said cavity.

2. An opto-electronic converter according to claim 1, wherein said quantum wire has:
   a length lying in the range 100 Å to 5,000 Å;
   a width lying in the range 20 Å to 500 Å; and
   a thickness lying in the range 2 Å to 10 Å.

3. An opto-electronic converter according to claim 1, wherein said current has a magnitude in the range of $10^{-8}$A to $10^{-16}$A.

4. An opto-electronic converter according to claim 1, wherein the material of said quantum wire is selected from the group consisting of: gold, silver, copper, platinum, and a gold-palladium alloy.

5. An opto-electronic converter according to claim 1, wherein the material of said quantum wire is selected from the group consisting of: a doped semiconductor, and an electron-conducting polymer.

6. An opto-electronic converter according to claim 1, wherein said photosensitive material is selected from the group consisting of: a photosensitizer, and a dye.

7. An opto-electronic converter according to claim 1, wherein said photosensitive material is selected from a II-VI semiconductor, and a III-V semiconductor.

8. An opto-electronic converter according to claim 1, wherein said electron mirrors comprise changes in the material at the ends of the wire, thereby defining an impedance break.

9. An opto-electronic converter according to claim 1, wherein said electron mirrors comprise interruptions in the wire over a distance of the order of 1 Å, thereby defining an impedance break.

10. An opto-electronic converter according to claim 6, wherein said photosensitizer comprises rhodamine B.

11. An opto-electronic converter according to claim 6, wherein said dye is selected from the group consisting of azo molecules, cyanines, thiazoles, and xanthenes.

12. An opto-electronic converter according to claim 7, wherein said II-VI semiconductor is selected from the group consisting of CdS and $CdS_xSe_{1-x}$.

13. An opto-electronic converter according to claim 7, wherein said III-V semiconductor consists of InGaAs.

* * * * *